(12) United States Patent
Rezvanitabar et al.

(10) Patent No.: US 12,339,141 B2
(45) Date of Patent: Jun. 24, 2025

(54) SYSTEMS AND METHODS FOR ADAPTIVELY REDUCING ACOUSTIC REFLECTIONS IN CAPACITIVE TRANSDUCERS

(71) Applicant: Georgia Tech Research Corporation, Atlanta, GA (US)

(72) Inventors: Ahmad Rezvanitabar, Atlanta, GA (US); Evren Fatih Arkan, Atlanta, GA (US); Fahrettin Levent Degertekin, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 365 days.

(21) Appl. No.: 18/005,435

(22) PCT Filed: Jul. 28, 2021

(86) PCT No.: PCT/US2021/043390
§ 371 (c)(1),
(2) Date: Jan. 13, 2023

(87) PCT Pub. No.: WO2022/026507
PCT Pub. Date: Feb. 3, 2022

(65) Prior Publication Data
US 2023/0258476 A1 Aug. 17, 2023

Related U.S. Application Data

(60) Provisional application No. 63/058,122, filed on Jul. 29, 2020.

(51) Int. Cl.
*G01D 5/24* (2006.01)
*B06B 1/02* (2006.01)
(Continued)

(52) U.S. Cl.
CPC .............. *G01D 5/24* (2013.01); *B06B 1/0292* (2013.01); *G01L 9/0073* (2013.01); *H03H 7/40* (2013.01); *B06B 1/0215* (2013.01)

(58) Field of Classification Search
CPC ...... G01D 5/24; B06B 1/0292; B06B 1/0215; H03H 7/38; H03H 7/40; G01L 9/0073
(Continued)

(56) References Cited

U.S. PATENT DOCUMENTS

| 2004/0267134 | A1 | 12/2004 | Hossack et al. |
| 2009/0251025 | A1 | 10/2009 | Kondou et al. |
| 2009/0322353 | A1* | 12/2009 | Ungaretti ............. G01L 9/0073 324/686 |

FOREIGN PATENT DOCUMENTS

WO    WO-2010094297 A1 *   8/2010   ............... H03H 7/38

OTHER PUBLICATIONS

International Search Report and Written Opinion from Application No. PCT/US2021043390 dated Nov. 4, 2021.
(Continued)

*Primary Examiner* — Yuqing Xiao
*Assistant Examiner* — Christopher Richard Walker
(74) *Attorney, Agent, or Firm* — Troutman Pepper Locke LLP; Ryan A. Schneider; Mark L. Jones

(57) ABSTRACT

Systems and methods are disclosed for improving broad bandwidth performance of CMUT elements and arrays using negative capacitance-based impedance matching. The disclosed systems and methods provide a controllable compromise balance between electrical power transfer, acoustic reflectivity, and signal-to-noise ratio. Certain implementations utilize active control of impedance network parameters based on a DC bias input to the CMUT. Instead of minimizing electrical reflection, acoustic reflectivity is controlled to provide improved SNR-bandwidth. Negative capaci-
(Continued)

tance-based matching is tunable to accommodate collapsed mode CMUTs where capacitance and frequency response changes significantly with DC bias.

23 Claims, 9 Drawing Sheets

(51) Int. Cl.
  *G01L 9/00* (2006.01)
  *H03H 7/40* (2006.01)
(58) Field of Classification Search
  USPC .......................................................... 367/181
  See application file for complete search history.

(56) References Cited

OTHER PUBLICATIONS

Arkan, E.F. "CMUT Array Design and Fabrication for High Frequency Ultrasound Imaging," Doctoral Disseration Apr. 20, 2020, Georgia Institute of Technology.
Rezvanitabar, et al., "Analysis of Negative Capacitance-Based Broadband Impedance Matching for CMUTs," IEE Transactions on Ultrasonics, Ferroelectrics, and Frequency Control, May 31, 2021, vol. 68, No. 9.

* cited by examiner

SYSTEMS AND METHODS FOR ADAPTIVELY REDUCING ACOUSTIC REFLECTIONS IN CAPACITIVE TRANSDUCERS

CROSS-REFERENCE TO RELATED APPLICATION

This application claims priority to U.S. Provisional Patent Application Ser. No. 63/058,122, filed on 29 Jul. 2020, entitled: "Adaptive Broadband Impedance Matching in Ultrasound Front-end Electronics for Capacitive Transducers," the contents of which are hereby incorporated by reference in their entirety as if presented herein in full.

STATEMENT REGARDING FEDERALLY SPONSORED RESEARCH OR DEVELOPMENT

This invention was made with government support under Award Nos. NS108391 and EB024253, awarded by the National Institutes of Health. The government has certain rights in the invention.

FIELD

This disclosure generally relates to systems and methods for reducing acoustic reflections in capacitive micromachined ultrasonic transducers (CMUTs) by adapting impedance. Certain implementations of the disclosed technology may reduce crosstalk in multi-element CMUT transducer arrays.

BACKGROUND

Capacitive micromachined ultrasonic transducers (CMUTs) are used in many ultrasonic imaging and sensing applications. Unlike conventional piezoelectric transducers, CMUTs can be manufactured using standard silicon semiconductor fabrication processes, which can reduce integration costs and increase yields, particularly when small-sized elements and/or multiple element arrays are needed.

As discussed in U.S. Patent Publication US20050219953 to Bayram, et al., which is incorporated herein by reference as if presented in full, CMUTs typically include a metal-coated silicon or silicon nitride microscale membrane suspended above a substrate. The substrate can be fabricated using undoped silicon with a metal layer and/or a highly doped semiconductor. The membrane and substrate mimic the plates of a parallel plate capacitor, in which the space between the plates can be controllable with a bias voltage applied across the membrane and substrate. The applied bias voltage can be used to adapt vibrational mode(s) of the CMUTs for frequencies of interest. Furthermore, an applied DC bias can be adjusted to cause the CMUT to operate in non-collapsed mode, a collapsed mode, or a deep collapsed mode. Additional information regarding CMUT electrode biasing may be found in Guldiken, R. et al. "CMUTS with dual electrode structure for improved transmit and receive performance." IEEE Transactions on Ultrasonics, Ferroelectrics and Frequency Control 53 (2006): 483-491, which is incorporated herein by reference as if presented in full.

Depending on the application, one may want to operate the CMUT in the non-collapsed or collapsed mode, wherein the applied DC bias voltage is under or above the pull-in voltage, respectively. Certain ultrasonic imaging and/or ultrasonic therapy applications can utilize one-dimensional (1D) and/or two-dimensional (2D) CMUT arrays. Additionally, CMUT elements in an array may be operated independently and/or connected in unison, enabling flexible and/or reconfigurable use for a wide variety of applications.

Factors such as CMUT element size, membrane-to-substrate gap spacing, bias voltage, etc., can affect the reactive response or the imaginary part of the electrical impedance due to capacitance of the CMUT, and in turn, impact electrical-to-acoustic power transfer and/or acoustic reflectivity of the array elements, which can negatively impact the overall SNR and system performance.

Negating the CMUT capacitance can be done through nulling. Narrowband nulling, for example, can be accomplished by adding an inductor to make a parallel LC tank. Since an LC tank resonates at a resonance frequency providing high impedance properties, inductance-based nulling of the capacitance severely reduces the operation bandwidth of a CMUT. Nulling, therefore, is not effective due to the inherent narrowband operation, and also due to the large inductors required, which are not suitable in integrated array implementation and particularly since the CMUT capacitive response changes with applied bias.

Accordingly, there is a need for improved systems and methods that can adaptively control CMUT impedance. Embodiments of the present disclosure are directed to this and other considerations.

BRIEF SUMMARY

The disclosed technology includes improved CMUT active impedance matching network systems and methods that may be utilized to improve power transfer and/or reflectivity performance of individual CMUT elements and/or connected arrays of CMUT elements.

The disclosed technology provides a tunable active matching network to adaptively cancel CMUT reactive behavior as a function of applied DC bias voltage. Circuit techniques are disclosed for controlling impedance, gain, and bandwidth of front-end electronics and particularly to ultrasonic CMUT. Certain exemplary implementations of the disclosed technology include broadband impedance matching techniques for CMUTs operating in collapsed and/or non-collapsed mode for maintaining gain and improving signal-to-noise (SNR) and frequency response. Certain exemplary implementations of the disclosed technology can include a tunable active matching network that generates a negative capacitance to cancel the reactive part of CMUT variable capacitance. The disclosed technology can enable improved broadband response, for example, when the CMUT is operated in collapsed mode with different DC bias voltages for multimodal imaging purposes.

Certain exemplary implementations of the disclosed technology may be utilized to reduce acoustic reflectivity and crosstalk in CMUT arrays, which can improve broader band frequency response and provide less variation of response among CMUT array elements.

In accordance with certain exemplary implementations of the disclosed technology, impedance matching may be adapted or optimized such that it differs from an impedance that would conventionally provide minimum acoustic reflectivity or maximum power transfer. In some implementations, a signal-to-noise ratio (SNR) may be improved by increasing pressure-to-signal conversion gain more than an associated increase in the system noise due to the active impedance matching circuit.

Consistent with the disclosed embodiments, an ultrasonic receiver system is provided for active impedance control. The system can include a capacitance micromachined ultrasonic transducer (CMUT) configured to receive an ultrasonic signal and a tunable impedance matching network in communication with the CMUT. The tunable impedance matching network includes a variable resistance and a variable negative capacitance. The system includes a DC bias input terminal in communication with the CMUT, and decision making circuitry in communication with the tunable impedance matching network and the DC bias input terminal. The decision making circuitry is configured to adjust one or more of the variable resistance and the variable negative capacitance to predetermined values responsive to a bias voltage input to the DC bias input terminal. The system further includes a readout circuit in communication with the tunable impedance matching network. The readout circuit is configured to output a signal corresponding to the ultrasonic signal received by the CMUT.

Consistent with the disclosed embodiments, a method is provided for actively controlling an impedance matching network of a CMUT receiver. The method includes receiving, with a capacitance micromachined ultrasonic transducer (CMUT), an ultrasonic signal, applying, at a DC bias input terminal in communication with the CMUT, a DC bias voltage, receiving, at a decision making circuit, the DC bias voltage, outputting, from the decision making circuit, one or more control signals to a tunable impedance matching network in communication with the CMUT. The tunable impedance matching network includes a variable resistance and a variable negative capacitance, and the one or more control signals adjust one or more of the variable resistance and the variable negative capacitance to predetermined values responsive to receiving the DC bias voltage. The method further includes outputting, from a readout circuit in communication with the tunable impedance matching network, a signal corresponding to the ultrasonic signal received by the CMUT.

Further features of the disclosed design and the advantages offered thereby are explained in greater detail hereinafter regarding specific embodiments illustrated in the accompanying drawings, wherein like elements are indicated be like reference designators.

BRIEF DESCRIPTION OF THE DRAWINGS

Reference will now be made to the accompanying drawings, which are not necessarily drawn to scale, and which illustrate various implementations and aspects of the disclosed technology and, together with the description, serve to explain the principles of the disclosed technology.

DETAILED DESCRIPTION

Figure 1:
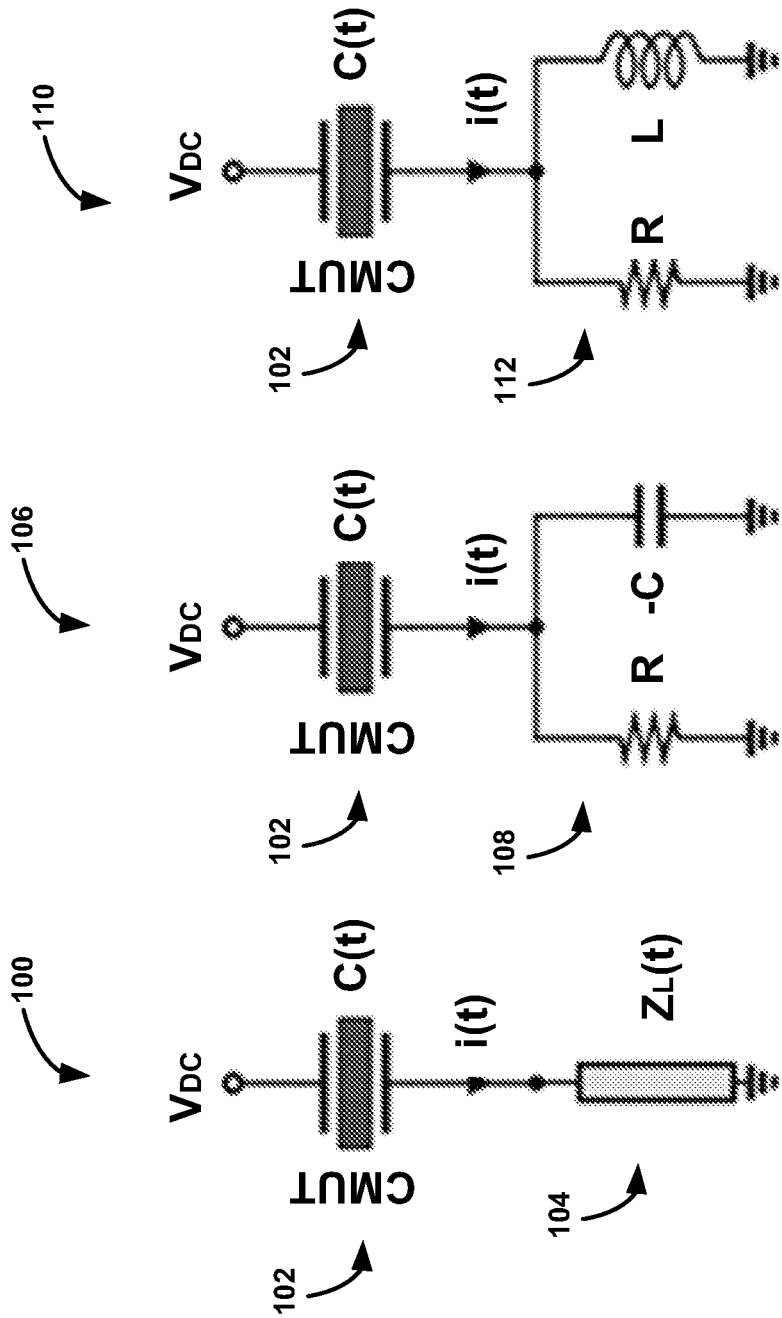
FIG. 1A depicts a circuit model 100 in which a CMUT element is modeled as linear time-varying capacitor C(t) 102 terminated by a load impedance $Z_L(t)$ 104.
FIG. 1B depicts a circuit model 106 in which a CMUT element is modeled as linear time-varying capacitor C(t) 102 terminated by a load impedance 108 comprising a parallel resistor (R) and negative capacitor (−C).
FIG. 1C depicts a circuit model 110 in which a CMUT element is modeled as linear time-varying capacitor C(t) 102 terminated by a load impedance 112 comprising a parallel resistor (R) and an inductor (L).

Active matching networks are disclosed herein for use with capacitive micromachined ultrasonic transducers (CMUTs) to reduce reflection and/or increase power transfer by negating the effect of the CMUT capacitive response. Certain exemplary implementations of the disclosed technology include a tunable active matching network to cancel CMUT reactive behavior, which is dependent on multiple parameters such as the DC bias voltage. The tunable active matching network can change the value of generated negative capacitance to cancel the reactive part of CMUT based on the CMUT capacitance, which can vary as a function of bias voltage. Certain exemplary implementations of the disclosed technology can enable broadband response when the CMUT is used under its collapsed mode with different DC bias voltages for applications such as multimodal imaging.

Certain exemplary implementations of the disclosed technology can be used to reduce acoustic reflectivity and/or crosstalk in CMUT arrays, which can provide improved broadband frequency response and provide less variation of response among CMUT array elements.

The disclosed technology includes methods to improve the signal-to-noise ratio (SNR) by increasing the pressure-to-signal conversion gain greater than the corresponding increase in the system noise due to the active impedance matching circuit. In certain exemplary implementations, selected optimum impedance matching values may be different than those values that would produce minimum acoustic reflectivity or maximum power transfer.

As discussed in "Analysis of Negative Capacitance Based Broadband Impedance Matching for CMUTs," A. Rezvanitabar, E. F. Arkan and F. Levent Degertekin, IEEE Transactions on Ultrasonics, Ferroelectrics, and Frequency Control, doi: 10.1109/TUFFC.2021.3079720, 13 May 2021, which is incorporated herein by reference as if presented in full, a CMUT array model, applied to a small 1-D CMUT array operating in the 5 MHz to 15 MHz range, was utilized (and experimentally verified) to highlight a surprising difference between electrical power transfer and acoustic reflectivity as well as the tradeoffs in SNR. It is generally understood that ideal negative capacitance termination matched to the CMUT capacitance can provide the broadest bandwidth and highest SNR if acoustic or electrical reflections are of no concern. However, negative capacitance and resistance matching to minimize acoustic reflectivity, as disclosed herein, provides both lower reflection and closer-to-ideal SNR as compared to the conventional approach uses purely negative capacitance for electrical power matching. Furthermore, as disclosed herein, acoustic matching also reduces acoustic crosstalk and improves array response uniformity. Implementations of the disclosed technology provide a new, viable broadband active impedance matching method for CMUTs operating in conventional and collapsed mode as well as other ultrasound transducers with mainly capacitive impedance.

One of the main advantages of using CMUTs is the ease of electronic integration, which can be achieved through wafer bonding, monolithic post-CMOS processing, or flip-chip bonding methods. This integration capability enables the implementation of 2-D imaging arrays with small element sizes and high impedance values to achieve high SNR and bandwidth, along with multiplexing capabilities for a reduced number of cables for catheter-based applications.

As disclosed herein, active matching circuits may be utilized to enable different impedance matching schemes for CMUT elements. In some implementations of the disclosed technology, electronics integration with CMUT technology may be utilized to achieve ideal or near-optimum electrical impedance levels of CMUTs and to reduce electrical and acoustic reflection from CMUT arrays due to mismatched impedance levels.

Impedance matching of CMUTs using a resistance-only load has been explored in detail including the impact of the medium and/or reflective surface backing on acoustic reflectivity. Assuming a real acoustic radiation impedance for the CMUT and limiting the termination to an optimized resistance, it has been found that a significant reduction in acoustic reflectivity and increased sensitivity can be obtained when CMUT elements are biased close (for example, within 90%) to the collapse voltage.

In accordance with certain exemplary implementations of the disclosed technology, impedance matching for CMUTs (suitable for integrated circuit implementation) may be used to cancel the capacitive part of the CMUT impedance using a negative capacitance circuit. Active circuits may be used to cancel parasitic capacitance, broaden the system bandwidth, and/or minimize acoustic reflection over a broad frequency range.

Conventional approaches to CMUT impedance matching have not differentiated electrical power transfer from acoustic reflectivity, and a real radiation impedance has previously been assumed for the CMUT. Although minimum acoustic reflectivity is highly desirable, it may not achievable simultaneously with the condition for maximum power transfer from the transducer: Minimum acoustic reflection can occur when acoustic impedance matching is achieved between the measuring medium and the CMUT surface. However maximum power transfer may occur when complex conjugate electrical impedance matching is achieved at the interface of the CMUT and front-end electronics (electrical port). In accordance with certain exemplary implementations of the disclosed technology, the difference between these two different requirements becomes more pronounced as the size of the CMUT transducers and CMUT array elements is smaller than the ultrasonic signal wavelengths.

The simplest model for CMUT consists of a parallel resistor and capacitor wherein both resistor and capacitor are functions of CMUT parameters and frequency. Although the resistive component makes the transformation of the mechanical energy to electrical energy possible, the capacitive component causes reactive power to be stored on the device and is not available for transfer to the interface electronics. The larger the CMUT capacitive component of the impedance relative to the real part, the more reactive power is trapped on the device, drastically decreasing the transducer power gain for interfacing with the associated electronics. The capacitive component of the impedance can change with DC bias in the non-collapsed mode and can change more drastically when operated in the collapsed mode. Furthermore, in a non-collapsed mode, the mechanical resonance of a CMUT determines the CMUT center frequency, which decreases with DC bias while the capacitance increases. In contrast, in collapsed mode, both the center frequency and CMUT capacitance increases with increased DC bias. Certain exemplary implementations of the disclosed technology include an interface circuit that can adapt to such changes and different operating modes.

As may be appreciated by the discussion above, a highly desirable goal for a CMUT array is to match impedance and reduce acoustical reflection with adaptable circuitry having variably controlled matching parameters. In certain exemplary implementations, such adaptable circuitry may be disposed between the CMUT element and the readout circuitry. In accordance with certain exemplary implementations of the disclosed technology, acoustical reflection may be minimized when the source impedance and the impedance seen from the input port are equal, while maximum acoustic to electrical power transfer may be obtained through conjugate matching. These two conditions explicitly define two different optimal cases at which minimum acoustic reflection or maximum transducer power gain is obtained. Therefore, it is desirable to implement a method and circuitry to control the CMUT interface and bring the system to its optimal points.

U.S. Pat. No. 7,670,290 to Hossack et al., discloses the use of conjugate matching for both optimal reflectivity and power transfer, as in the case where a CMUT array element is large compared to the ultrasonic signal wavelength. In such a case, the acoustic impedance is close to the pure resistive state and impedance matching values for optimal reflectivity and power transfer are the same. However, as discovered by the inventors of the present inventions, conjugate matching does not produce optimal reflectivity and power transfer when the CMUT element dimensions are on the order of $\lambda/2$ (or smaller) where $\lambda$ is the ultrasonic signal wavelength, as is increasingly the case for state-of-the-art CMUTs and CMUT arrays.

Analysis of a 5 MHz CMUT array biased to 75% collapse voltage distinguishably confirms the separation between optimal points for minimum acoustic reflection and maximum power transfer. For instance, analysis (using a 2-8 MHz echo signal power when the CMUT is terminated with different R and C values in parallel) confirms a minimum reflectivity at 120 k$\Omega$||−20.75 pF termination, and maximum power transfer at 70 k$\Omega$||−20.75 pF termination. According to an exemplary implementation of the disclosed technology, matching network circuit values for a desired optimal operation may be set between such extremes. As will be discussed below with reference to FIG. 10, the matching network circuit values may be automatically adjusted based on an input DC bias. In certain exemplary implementations, a readout scheme can be selected based on the operation frequency, the required termination values, and reflectivity vs power transfer priority.

A benefit of using CMUTs is that the vibrational mode(s) of the CMUTs can be adapted to frequencies of interest by adjusting a DC bias voltage across the CMUT electrodes. Following certain exemplary implementations of the disclosed technology, the DC bias can be adjusted to cause the CMUT to operate in non-collapsed mode, a collapsed mode, or a deep collapsed mode. Additional background information regarding electrode biasing may be found in Guldiken, R. et al. "CMUTS with dual electrode structure for improved transmit and receive performance." IEEE Transactions on Ultrasonics, Ferroelectrics and Frequency Control 53 (2006): 483-491, which is incorporated herein by reference as if presented in full.

In the non-collapsed mode, the membrane diaphragm of the CMUT can vibrate responsive to a received acoustic/ultrasonic field (for detection) and/or an applied AC voltage across the electrodes (for acoustic/ultrasonic field emission). In this non-collapsed mode, the CMUT diaphragm can operate analogously to a drumhead constrained at the edges. In certain exemplary implementations, an application of a small DC bias across the electrodes may cause a small variation in the associated frequency response due to electrostatic deflection of the associated diaphragm.

In certain exemplary implementations, the DC bias may be increased so that the top electrode/diaphragm is attracted towards the bottom electrode. According to an exemplary implementation of the disclosed technology, the CMUT may be configured so that upon application of a sufficient DC bias, a central portion of the diaphragm will make contact with the bottom portion of the CMUT, thereby constraining the diaphragm at both edges and the center. Such collapsed-mode operation has the effect of changing the resonance characteristics such that the associated frequency response of the CMUT may be increased since the effective fundamental vibrational mode has been changed due to the additional constraining point where the center of the diaphragm touches the bottom. This typically results in a significant increase in the frequency response (and a corresponding shift in the center frequency) compared to the non-collapsed state. Certain implementations of the disclosed technology may utilize such a biasing feature to select different modes of frequency operation for different purposes, as will be explained below.

Certain exemplary implementations of the disclosed technology may utilize an even greater DC biasing voltage to cause the CMUT to operate in a deep-collapsed mode, in which a region of contact (by the diaphragm with the bottom portion of the CMUT) may be increased with increasing biasing, thereby further changing the resonance characteristics of the diaphragm and (typically) increasing the resonant frequency and associated frequency response.

Under certain exemplary implementations of the disclosed technology, large bandwidths (0.1-10 MHz) may be achieved using a CMUT with a single lateral size. In other implementations, thin membranes and/or CMUT arrays or elements can be formed by combining multiple membrane sizes, each covering a certain frequency band. In this case, signals picked up by these membranes may be combined into a single signal by electrically connecting the elements to form a single element, and/or by detecting and processing the signals with separate elements. In certain implementations, separate signals from separate elements may be combined using phase delays.

According to an exemplary implementation of the disclosed technology, silicon-based miniaturization and electronics integration may be utilized to provide subarrays with element spacing (down to $\lambda/2$ for the desired frequencies) while keeping the number of connecting cables at a manageable size. For example, 256 sub-arrays, each containing 32 elements can be managed with about 1000 micro-cables. In certain exemplary implementations, multiplexing may be utilized to reduce the count of the micro-cables.

Certain exemplary implementations of the disclosed technology employ impedance matching to optimize power transfer from acoustic to the electrical domain while minimizing acoustic reflections from the surface of the array. Given the complex electrical input impedance of the CMUT array element, $Z_{CMUT}(\omega)$, which can take into account fluid loading and interactions with other array elements, the frequency-dependent electrical power reflection coefficient at the electrical interface as a function of frequency is given as:

$$|R_E(\omega)|^2 = \left| \frac{Z_{in}(\omega) - Z^*_{CMUT}}{Z_{in}(\omega) + Z_{CMUT}} \right|^2, \quad (1)$$

where * denotes complex conjugate and $Z_{in}(\omega)$ is the input impedance of the receiver electronics. As expected from the maximum power transfer theorem, power reflection is minimized by complex conjugate matching in the electrical domain. Note that this figure is relatively straightforward to calculate once $Z_{CMUT}$ is known, as all electromechanical interactions in CMUT are properly included in a single complex number. Consequently, for a limited and relevant bandwidth of the CMUT array element (from $\omega_1$ to $\omega_2$) the effective power reflection coefficient can be expressed as:

$$ER_E = \frac{\int_{\omega_1}^{\omega_2} |R_E(\omega)|^2 d\omega}{|\omega_2 - \omega_1|}, \quad (2)$$

To highlight the difference between the acoustic and electrical reflection coefficient, the acoustic pressure reflection coefficient at the mechanical interface of a transducer and radiation medium can be expressed as:

$$R_A(\omega) = \frac{Z_{ina}(\omega) - Z_{rad}(\omega)}{Z_{ina}(\omega) + Z_{rad}(\omega)}, \quad (3)$$

where $Z_{ina}(\omega)$ is the complex mechanical impedance seen looking into the mechanical port of the CMUT and $Z_{rad}(\omega)$ is the complex radiation impedance of the medium including array effects. Unlike the electrical power reflection coefficient, minimum acoustic reflectivity does not require complex conjugate matching and the difference becomes significant when the radiation impedance is complex.

Equation (3) is convenient to use with a simple 1-D equivalent circuit and provides accurate insight for large area transducers. However, for realistic CMUT array elements with arbitrary or sub-wavelength dimensions, a more complex coupled electrical-acoustic model considering membrane and array dynamics may provide more accurate results. The acoustic reflectivity can then be evaluated through electrical signals due to multiple reflections (echoes) between an ideal flat target and a CMUT can be calculated. In this case, the effective acoustic reflection coefficient at the CMUT array surface may be expressed as:

$$|R_{AE}(\omega)|^2 = \frac{|V_2(\omega)|^2}{|V_1(\omega)|^2}, \quad (4)$$

where $|V_1(\omega)|$, $|V_2(\omega)|$, are the electrical signals in the frequency domain for the first and second echoes, respectively, obtained at the receiver electronics terminals. Similar to the effective electrical power reflection, $ER_E$, the effective acoustic reflection coefficient, $ER_A$, over a frequency band of interest may be expressed as:

$$ER_A = \frac{\int_{\omega_1}^{\omega_2} |R_{AE}(\omega)|^2 d\omega}{|\omega_2 - \omega_1|}. \quad (5)$$

Referring now to the figures, exemplary embodiments of the disclosed technology are herein described. It is to be understood that the figures and descriptions of the disclosed technology have been simplified to illustrate elements that are relevant for a clear understanding, while eliminating, for purposes of clarity, other elements found in typical electronics circuits and associated devices. Those of ordinary skill in the art will recognize that other elements may be desirable and/or may be required to implement the disclosed technology. However, because such elements are well known in the art, and because they may not facilitate a better understanding, a discussion of such elements is not provided herein.

FIG. 1A depicts a circuit model 100 in which a CMUT element is modeled as linear time-varying capacitor C(t) 102 terminated by a load impedance $Z_L(t)$ 104.

FIG. 1B depicts a circuit model 106 in which a CMUT element is modeled as linear time-varying capacitor C(t) 102 terminated by a load impedance 108 comprising a parallel resistor (R) and negative capacitor (−C).

FIG. 1C depicts a circuit model 110 in which a CMUT element is modeled as linear time-varying capacitor C(t) 102 terminated by a load impedance 112 comprising a parallel resistor (R) and an inductor (L).

Another metric for receiver performance is the achievable signal to noise ratio (SNR), which may be calculated from the ratio of the output signal voltage to the voltage noise on the termination impedance due to the CMUT element and termination impedance. These figures can be calculated as a function of frequency and integrated over a bandwidth to arrive at an effective SNR for different termination schemes indicated in FIG. 1A, FIG. 1B, and/or FIG. 1C.

Figure 2:
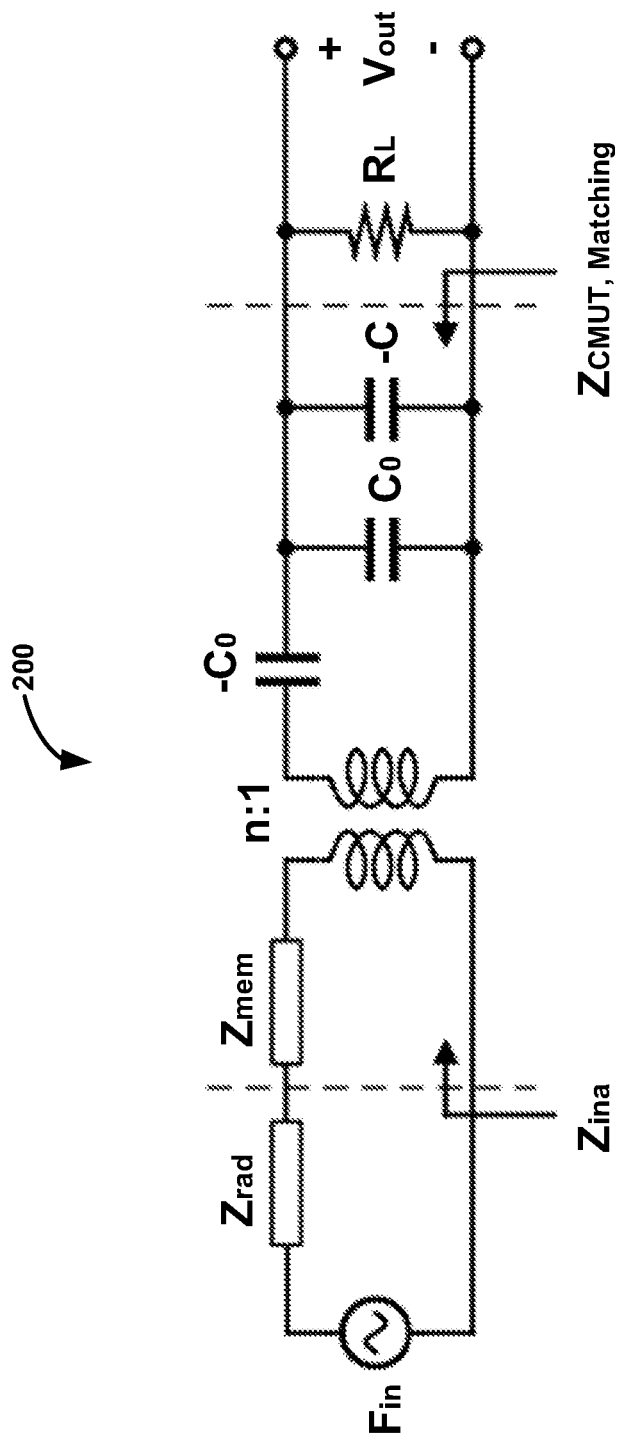
FIG. 2 depicts a small-signal equivalent circuit 200 for a CMUT in receive mode, according to certain implementations of the disclosed technology, in which Zrad and Zmem are the total impedances which are the normalized impedances multiplied by an effective area of the CMUT.

FIG. 2 depicts a small-signal equivalent circuit 200 for a CMUT in receive mode, according to certain implementations of the disclosed technology, in which Zrad and Zmem are the total impedances which are the normalized impedances multiplied by an effective area of the CMUT. In this example circuit 200, $n = V_{DC} C_0/g$ is the electromechanical transformation ratio, in which $V_{DC}$ is the applied DC bias, $C_0$ is the CMUT capacitance, and g is the gap between CMUT plates with the bias. The $-C_0$ element represents the spring softening due to the electromechanical coupling with applied bias. The force $F_{in}$ is given by the blocked pressure and device area, i.e. $F_{in} = 2P_{in} \times A$. Given this equivalent circuit, the reflectivity at the mechanical (acoustic) port can be derived from equation (3) above as:

$$R_A(\omega) = \frac{Z_{ina}(\omega) - Z_{rad}(\omega)}{Z_{ina}(\omega) + Z_{rad}(\omega)} = \frac{Z_{mem} + n^2 Z - Z_{rad}}{Z_{mem} + n^2 Z + Z_{rad}}, \quad (6)$$

where $$Z = \left(\frac{1}{(C_0 - C)j\omega} \| R_L\right) - \frac{1}{C_0 j\omega}.$$

The power reflection coefficient for the electrical power transfer to the load, $R_L$, may be expressed as:

$$|R_E(\omega)|^2 = \left|\frac{R_L - Z^*_{CMUT, Matching}}{R_L + Z_{CMUT, Matching}}\right|^2, \quad (7)$$

where $Z_{CMUT, Matching}$ is the input electrical impedance of the CMUT including the negative capacitance, and * denotes the complex conjugate.

To estimate the impact of parallel negative capacitance, one can first assume a limiting case where $Z_{rad}$ is real (such as $Z_{rad} = A \times \rho c$, for a large transducer), c is chosen to be arbitrarily close to $C_0$ so that the $$\left(\frac{1}{(c_0 - c)_{j\omega}} \| R_L\right) \approx R_L.$$

By defining a short circuit mechanical impedance $$z_{ms} = z_{mem} - \frac{n^2}{j\omega c_0},$$

at the softened (short circuit) mechanical resonance frequency of the CMUT, ($Z_{ms}=0$) both acoustic and electrical power reflection coefficients vanish by choosing $R_L = Z_{rad}/n^2$ indicating a perfect match. The bandwidth of this matching depends on the variation of the membrane mechanical impedance with frequency and its relative value as compared to $Z_{rad}$ as the output voltage can be expressed as:

$$V_{out} \approx \frac{R_L}{R_L + \frac{Z_{rad} + Z_{ms}}{n^2}} \times \frac{F_{in}}{n} = \frac{Z_{rad}}{2Z_{rad} + Z_{ms}} \times \frac{F_{in}}{n}. \quad (8)$$

Since a CMUT membrane mechanical impedance is usually designed to be significantly smaller than the radiation impedance, giving the CMUT its broad bandwidth, one should expect (−C//R) matching to provide a broadband matching and output voltage frequency response limited by the membrane design. This is in contrast with (L//R) matching, where the capacitance is canceled only around a narrow frequency band. Although this approach seems to reduce the output signal level as compared to an open circuit termination by voltage division, (−C//R) matching eliminates the capacitive drop-off and can yield higher output signal levels in a broader frequency range.

For arbitrary sized transducers, frequencies, and negative capacitance values, certain implementations of the disclosed technology may select load resistance values to minimize the expressions in equations (6) and (7) to reduce the acoustic reflectivity and increase electrical power transfer at the desired frequency, respectively. This yields $$R_{LE} = \left| \left( \frac{n^2}{Z^*_{rad} + Z^*_{ms}} - (C_0 - C)j\omega \right)^{-1} \right|, \quad (9)$$

for electrical power transfer. The resistance value for minimizing acoustic reflectivity can be obtained by evaluating equation (6) since a closed-form expression is not trivial. As in the case of microwave circuits these values are not the same, as $Z_{rad}$ is complex and $Z_{ms}$ is non-zero in general, and they depend on CMUT size and membrane design.

In addition to output signal levels for different terminations, the equivalent circuit can also be used to evaluate the noise voltage spectrum due to the thermal-mechanical noise of the CMUT and the load resistance, through the expression $$v_n^2 = 4kTRe\{Z_{in\_e}(\omega)\}, \quad (10)$$

where $Z_{in\_e}(\omega)$ is the electrical input impedance at the output terminal including the load resistance. This approach assumes noiseless receiver electronics and hence is an ideal case. Nevertheless, to gain insight into these matching schemes on signal bandwidth, SNR, and reflectivity, one can use the equivalent circuit approach, albeit with its limitations.

TABLE 1 lists properties for two example square-shaped 5-MHz single-element CMUTs (SE_CMUT1 and SE_CMUT2) and an example CMUT array. The equivalent circuit analysis, as discussed above, was used to evaluate performance metrics for these example devices. The SE_CMUT1 has a side length of 161 μm and SE_CMUT2 has a side length of 659 μm, roughly corresponding to λ/2 and 2λ at 5 MHz respectively in the simulation medium, which is water. These sizes are chosen to explore the limitations of the equivalent circuit approach leading to the need for more accurate analysis. The membranes are modeled as lossless mass-spring system $$\left( Z_{mem} = j\left(\omega m_{eff} - \frac{k_{eff}}{\omega}\right)\right),$$

where membrane equivalent mass and stiffness and collapse voltage are obtained using the FEA and BEM analysis, and the radiation impedance is calculated for square apertures.

TABLE 1

| Parameter | SE_CMUT1 | SE_CMUT2 | CMUT Array |
|---|---|---|---|
| No. of Membranes | 4 | 64 | 80 (per element) |
| Membrane Size | 78 × 78 μm² | 78 × 78 μm² | 46 × 46 μm² |
| Electrode Area Coverage | 59% | 59% | 68% |
| Membrane Spacing | 5 μm | 5 μm | 6 μm |
| Membrane Thickness | 1.5 μm | 1.5 μm | 2.2 μm |
| Vacuum Gap | 125 nm | 125 nm | 95 nm |
| Dielectric Relative Permittivity | 15 | 15 | 6.3 |
| Si$_x$N$_y$ Isolation Thickness | 40 nm | 40 nm | 200 nm |
| Collapse Voltage | 14 V | 14 V | 40 V |

Figure 3:
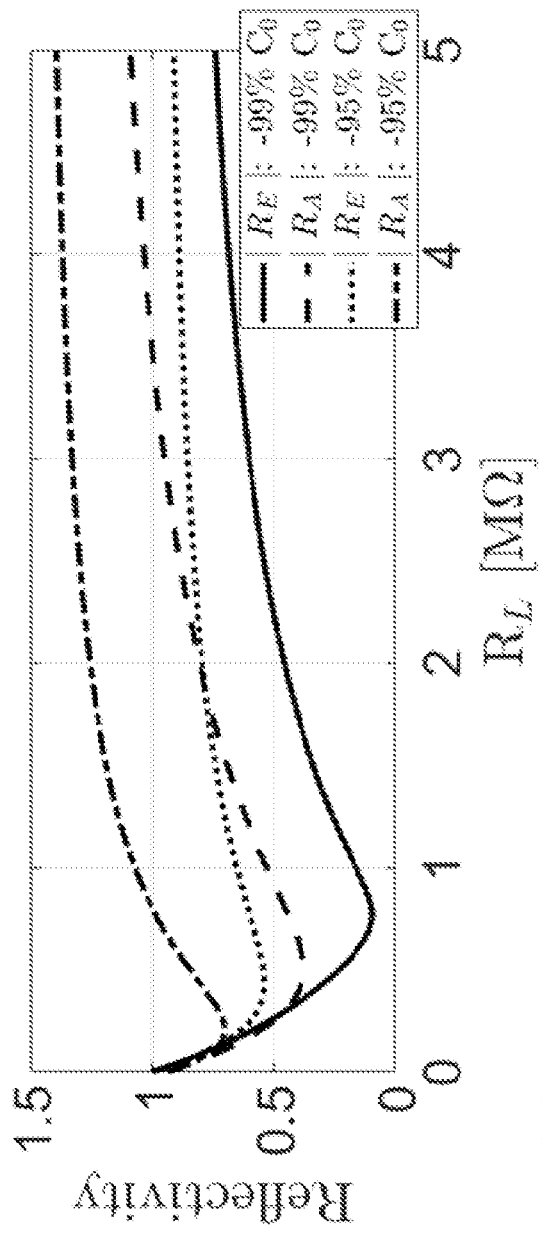
FIG. 3 depicts modeled reflectivity magnitude as a function of termination resistance for a single element CMUT with a side length of 161 μm and a (−C//R) termination (C0=1.72 pF).

FIG. 3 depicts modeled variation of acoustic reflectivity magnitude $|R_A(\omega)|$ and electrical reflectivity magnitude $|R_E(\omega)|$ at 5 MHz for C=0.99C$_0$ and C=0.95C$_0$ for SE_CMUT1 as a function of termination resistance for a single element CMUT with a side length of 161 μm and a (−C//R) termination (C0=1.72 pF).

Figure 4:
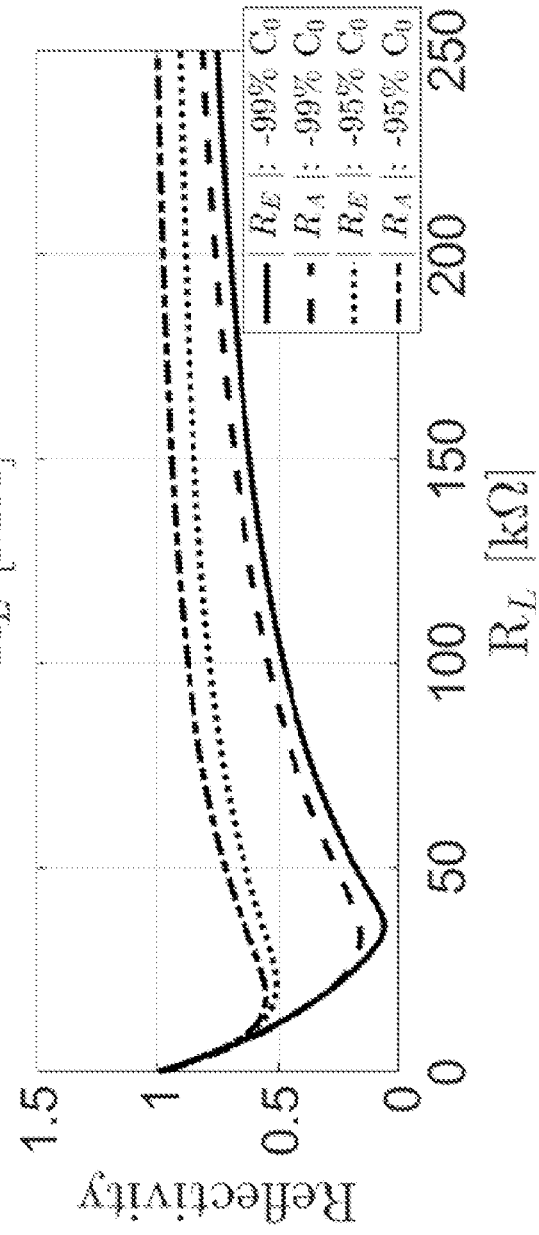
FIG. 4 depicts modeled reflectivity magnitude as a function of termination resistance for a single element CMUT with a side length of 659 μm and a (−C//R) termination (C0=27.56 pF).

FIG. 4 depicts modeled variation of the acoustic reflectivity magnitude $|R_A(\omega)|$ and electrical reflectivity magnitude $|R_E(\omega)|$ at 5 MHz for C=0.99C$_0$ and C=0.95C$_0$ for SE_CMUT1 as a function of termination resistance for a single element CMUT with a side length of 659 μm and a (−C//R) termination (C0=27.56 pF).

The load resistance for SE_CMUT1 to minimize acoustic reflectivity is R$_L$=520 kΩ, but the load resistance to minimize power reflection is significantly different: R$_L$=767 kΩ (as predicted by equation (9) above). As expected, the minima are reduced with improved matching with the CMUT capacitance. This match is limited to 99% as an exact match may cause stability issues in practical implementation. Furthermore, acoustic reflectivity is larger than unity at certain resistance values which is not physical, while electrical reflectivity is always below unity, indicating the limitation of this simple 1-D equivalent circuit formulation for the acoustic reflectivity analysis of small-sized transducers. Calculations for SE_CMUT2 show that the optimal resistances are closer to each other (R$_L$=33.5 kΩ for acoustic and R$_L$=35.5 kΩ for electrical power) as expected from the above analysis and the validity of the 1-D acoustic reflectivity that improves with increasing transducer size. In the large transducer (SE_CMUT2), the imaginary part of the electrical impedance is due to C$_0$, and hence one can extract R$_L$ for the best electrical match from a parallel RC model fitting.

The broad bandwidth of the (−C//R) matching scheme as compared to the (L//R) matching was evaluated by analysis of $|R_A(\omega)|$ and $|R_E(\omega)|$ as a function of frequency for the SE_CMUT2 optimal electrical load resistance value for these two different matching schemes. Results indicate that an advantage of negative capacitance-based matching is a significantly higher bandwidth as compared to inductive matching. When using a simple 1-D equivalent circuit formulation, acoustic reflectivity formulation can give inaccurate results at low frequencies, particularly when the effective CMUT size is on the order of a subwavelength or smaller. As will be discussed below, certain exemplary implementations of the disclosed technology may utilize a time-domain approach to provide more accurate results for such cases.

The impact of different matching schemes on the output signal and achievable SNR levels was also investigated on the SE_CMUT2 example. In addition to (−C//R) and (L//R) matching, the case of only −C matching, i.e. −C in parallel with 1 GΩ (−C), and 1 GΩ (OC) conditions were evaluated. In the case of an open circuit termination (such as the case of a voltage amplifier), the results indicate that negative capacitance provides a nearly flat output response as it removes the impact of the reduction in impedance due to the CMUT capacitance and parasitic capacitance. In this case, high bandwidth may be achieved with high acoustic and electrical reflectivity. With (−C//R) matching, the broad bandwidth is retained with ~5 dB lower output signal, but the acoustic and electrical reflectivity are significantly reduced. Interestingly, the voltage sensitivity is significantly (>20 dB) higher than the open circuit termination in the bandwidth of interest. Therefore, in accordance with certain example implementations of the disclosed technology, (−C//R) termination may be utilized to provide higher sensitivity (output signal) and bandwidth as compared to a typical high impedance voltage amplifier termination.

Corresponding noise voltage calculations were evaluated, in which the CMUT thermal-mechanical noise and the noise due to the termination resistance were taken into account. The results indicate that with (−C//R) and (L//R) terminations, there is about 3 dB degradation in the SNR as compared to open circuit or −C type terminations. This indicates that there is a trade-off between reduced reflectivity and SNR. However, in many cases, the noise in the system is not limited by the CMUT and termination impedance noise but by other noise sources such as transmit-receive switch resistance and amplifier noise. In cases where the dynamic range is limited by these other noise sources, the significant increase in signal level and bandwidth achieved with (−C//R) matching can increase the overall SNR and dynamic range, even with the additional noise due to the active circuitry.

Although the simple 1-D model equivalent circuit analysis provides a certain amount of insight and guidance for negative capacitance matching optimization, such analysis may not consider the complex CMUT membrane and array dynamics with acoustic interactions, and higher-order membrane vibration modes, which can be significant in determining the CMUT performance and bandwidth. Furthermore, it was determined that the evaluation of acoustic reflectivity using the 1-D model may not be adequate for smaller-sized CMUT array elements as discussed above.

To address the deficiencies of the simple 1-D model, a more realistic and comprehensive analysis utilizing an experimentally verified SIMULINK based CMUT array model was utilized, in which a time-domain model receive mode voltage and current may be expressed as:

$$\begin{cases} V(t) = V_{DC} - i(t) \times \mathcal{F}^{-1}\{Z_T(\omega)\} \\ i(t) = \dfrac{dQ(t)}{dt} = \dfrac{d(V(t) \times C(t))}{dt} \end{cases} \quad (11)$$

where $\mathcal{F}^{-1}$ is the inverse Fourier transform, $V(t)$ is the voltage across variable capacitor $C(t)$, a time-varying capacitor in the electrical domain, $i(t)$ is the output current of the variable capacitor, and $Z_T$ is the termination impedance including the matching circuit and the load. These load and matching circuit impedances, and any parasitic capacitance can be included in the model directly or as finite impulse response (FIR) filters. For the case of an ideal −C//R matching, the method could be further simplified by dividing the termination impedance and matching circuit to obtain output voltage and current, which can be expressed as:

$$\begin{cases} V(t) = V_{DC} - i(t) \times R \\ i(t) = \dfrac{dQ(t)}{dt} = \dfrac{d(V(t) \times C(t) - C))}{dt} \end{cases} \quad (12)$$

In the time-domain model, the CMUT array element impedance, $Z^*_{MUT}$ can be extracted by simulating the output current to a Gaussian input voltage pulse in short-circuit termination to be used for noise calculations as well as obtaining the RC model parameters.

For comparison with the equivalent circuit results, the SE_CMUT2 device was simulated using the time domain model to extract the impedance and RC model fit in the frequency band of 2.5 to 7.5 MHz. This results in R=55 kΩ at 5 MHz (different from the simple equivalent circuit), which is used to determine the element values for the L//R and −C//R matching circuits. The electrical power reflection coefficient as a function of frequency for different terminations including OC (1 GΩ) and −C (−20.57 pF//600 kΩ) cases indicate that the resistance value(s) for −C termination is limited to smaller values as compared to OC case, due to the numerical instabilities observed while simulating cases with high −C and R values. The L//R matching result is similar with a narrowband matching and OC and −C matching results in unity reflection. The −C//R termination can provide low power reflection over a significantly broader bandwidth, but as compared to the equivalent circuit-based results, crosstalk effects are seen at low frequencies and the bandwidth at the high-frequency end is limited by higher-order membrane vibration modes. The effective electrical reflection, $ER_E$, calculated using equation (2) over the 2.5-7.5 MHz bandwidth is obtained to be 92.96% for L//R, and 18.75% for −C//R matching.

Figure 5:
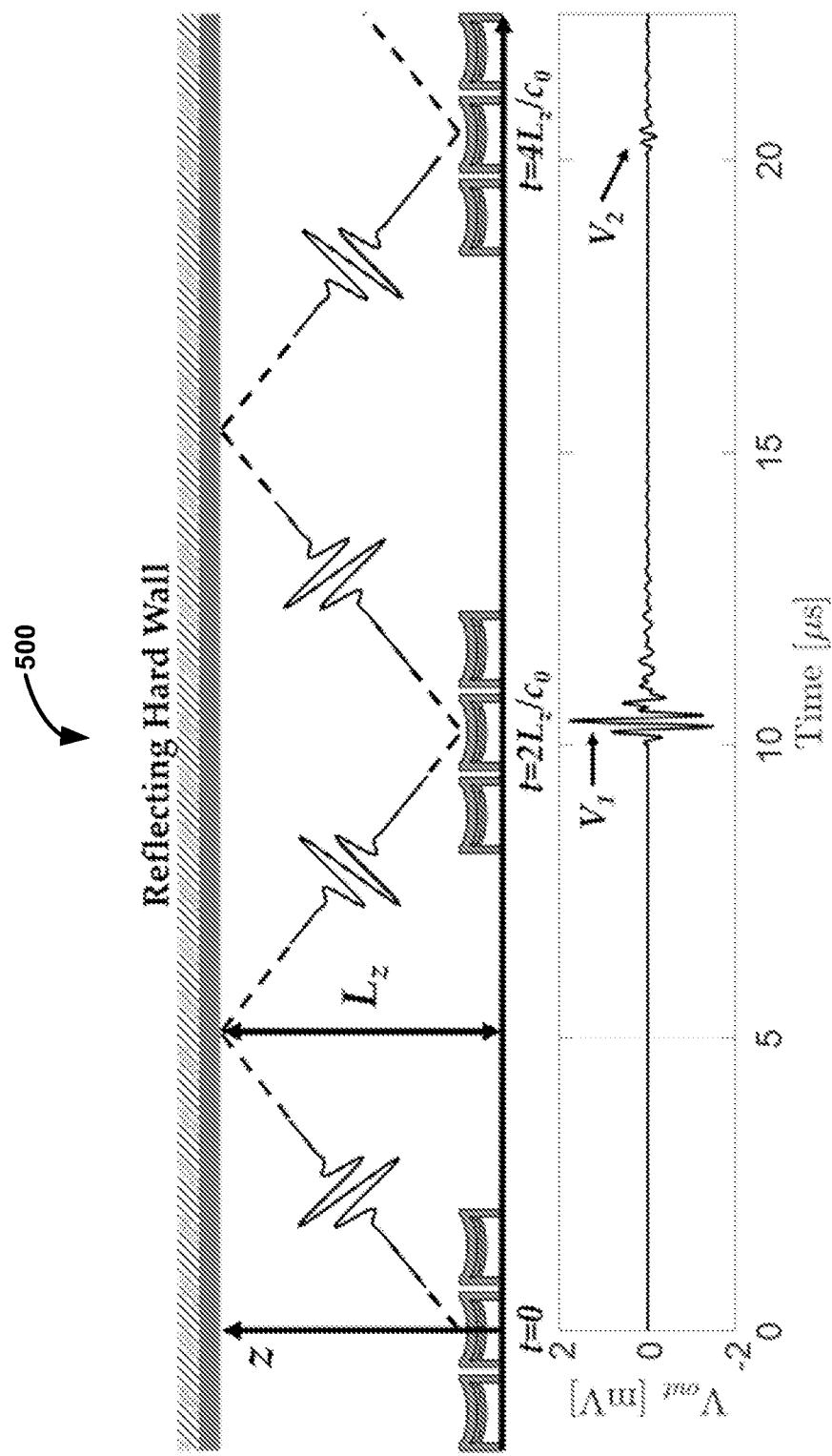
FIG. 5 depicts a pulse-echo arrangement 500 for modeling CMUT element crosstalk due to acoustic reflection.

FIG. 5 depicts a pulse-echo arrangement 500 for modeling and evaluating CMUT element crosstalk due to acoustic reflection. The time-domain model was utilized to evaluate the acoustic reflectivity $R_{AE}(\omega)$ using equation (5). The CMUT element was excited with a short pulse and multiple time-domain echo signals from a perfect planar reflector at a certain distance (in this case 7.5 mm) were simulated. The resulting ratios of the second to first echo spectra in dB over the frequency range of interest were used to compare the $ER_A$ of different receiver electrical terminations. In this particular case, the signals and $R_{AE}(\omega)$ for an optimized case of $ER_A$ with R=90 kΩ indicate that acoustic reflectivity curves are similar for all cases except for −C//R case which reduces the reflectivity over a broad range in the targeted bandwidth. In contrast with the equivalent circuit model, the resistance for −C//R matching minimizing $ER_A$ is larger than the value minimizing $ER_E$. Also, unlike the electrical power reflection, in a realistic case the acoustic reflection $R_A$ will not be eliminated at any frequency as the space between the CMUT membranes and the area outside the array is modeled as a rigid baffle. Furthermore, the improvements in $R_A$ are relative since the individual echo levels depend on diffraction, i.e. the distance between the CMUT array and the planar reflector, in addition to the CMUT array acoustic impedance. Nevertheless, this metric was used to investigate and minimize the acoustic reflectivity of the CMUT array by comparing it for different terminations.

CMUT imaging arrays are usually formed by subwavelength elements with a large number of membranes. In accordance with certain exemplary implementations of the disclosed technology, a time-domain model was determined to be the best approach for determining the impact of negative capacitance-based impedance matching on bandwidth, acoustic reflection, and possible SNR for an array of CMUT elements. As listed in the far right-hand column of TABLE 1, a small 1-D CMUT array designed to operate in a frequency range suitable for intra-cardiac echocardiography (ICE) imaging was analyzed. When operating at a center frequency ($f_0$) of 9 MHz, this array had a 65% fractional bandwidth (FBW).

An array having 240 individual membranes and overall dimensions of 0.312 mm by 2.08 mm were analyzed for dominant acoustic crosstalk effects and thus deemed suitable to interpret the impact of electrical matching on array crosstalk and to perform a parametric study for $ER_E$ and $ER_A$ optimization. The array element impedance is approximated as a (16 kΩ//7.38 pF) for a DC bias of 90% collapse at 36V bias, where the capacitance value is the static capacitance, $C_o$, at this bias. To obtain the time domain voltage signals, pulse-echo signals from the center and side elements are obtained by exciting the center element with a 50-ns-width 36-V unipolar pulse. First and second echo signals at the terminals of the center and edge elements were simulated for a perfect reflector 1 cm away from the array for OC (1GΩ), −C(−7.01 µF∥500 kΩ), L//R (45 µH∥16 kΩ), and −C//R (−7.31 µF∥105 kΩ) terminations. These values correspond to perfect complex conjugate matching for L//R matching at 9 MHz and optimum negative capacitance acoustic matching.

Figure 6:
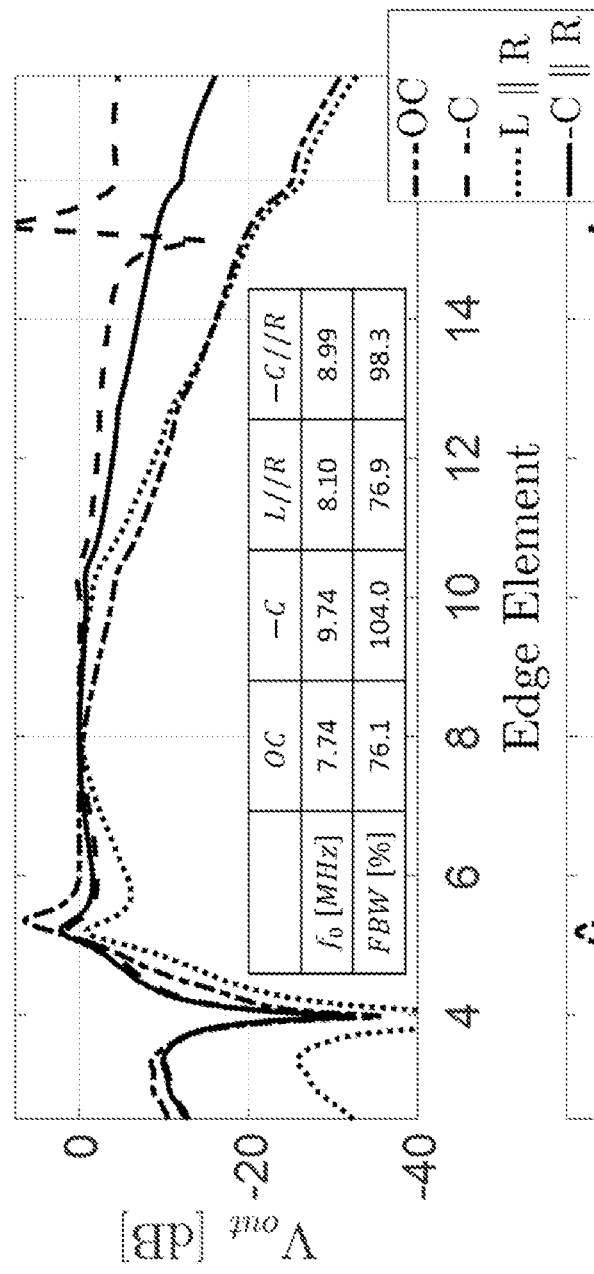
FIG. 6 depicts a normalized frequency spectrum of the echo signals for different terminations for the center element of the CMUT array.

FIG. 6 depicts a normalized frequency spectrum of the echo signals for different terminations for the center element of the CMUT array.

Figure 7:
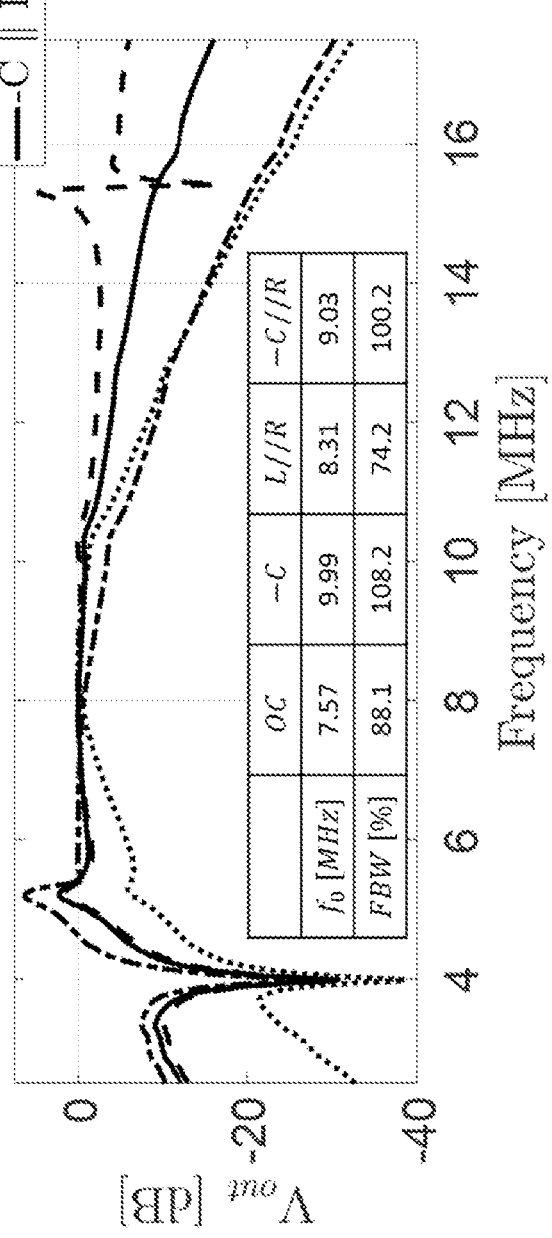
FIG. 7 depicts a normalized frequency spectrum of the echo signals for different terminations for an edge element of the CMUT array.

FIG. 7 depicts a normalized frequency spectrum of the echo signals for different terminations for an edge element of the CMUT array. Broadband negative capacitance matching provides the broadest fractional bandwidth and the smallest difference between the center and edge elements.

As seen in FIG. 6 and FIG. 7, where the frequency spectrums for the first echo signals for the center and edge elements are plotted, negative capacitance (−C) termination provides the maximum amplitude for the first echo signal, and (−C//R) termination generates larger output signal as compared to the OC case. Maximum reduction in echo amplitude from first to the second echo is obtained in (−C//R) case, as expected, indicating the improvement in acoustic reflectivity. In addition, ringing in the echo signals is minimized indicating a broader bandwidth. These trends are in line with the general predictions of the 1-D equivalent circuit model, but there are significant differences and additional information provided by the coupled time-domain model. Negative capacitance (−C) termination provides a nearly flat frequency response, but it also enhances a higher-order membrane mode around 15 MHz, which causes the ringing. Similar to the SE_CMUT2 case as discussed above, the resistance value for optimum acoustic matching is significantly larger than the resistance for optimum electrical power transfer, which is a non-obvious conclusion of the disclosed technology.

In accordance with certain exemplary implementations of the disclosed technology, proper broadband matching termination affects the CMUT array response such that the array elements show similar responses with a negligible mismatch in frequency components of their spectra. Furthermore, the mismatch difference between edge and center elements is smallest for (−C//R) matching. The uniformity of the CMUT array response may be improved in accordance with certain exemplary implementations of the disclosed technology by reducing acoustic crosstalk effects because it allows the array to absorb most of the incident acoustic energy, which can be an important technical advantage of broadband acoustic matching and a significant advancement in the technology.

To further emphasize the reduction in scattered pressure from the CMUT array elements, acoustic pressure echo signals at the CMUT surface were analyzed. Results indicate that −C//R termination significantly reduces the scattered pressure.

To observe overall trends and tradeoffs between electrical, acoustic matching, and SNR for different matching schemes, effective electrical power reflectivity ($ER_E$) and effective acoustic reflectivity ($ER_A$) in the 5-15 MHz range were calculated for the CMUT array as a function of load resistance and negative capacitance.

Figure 8:
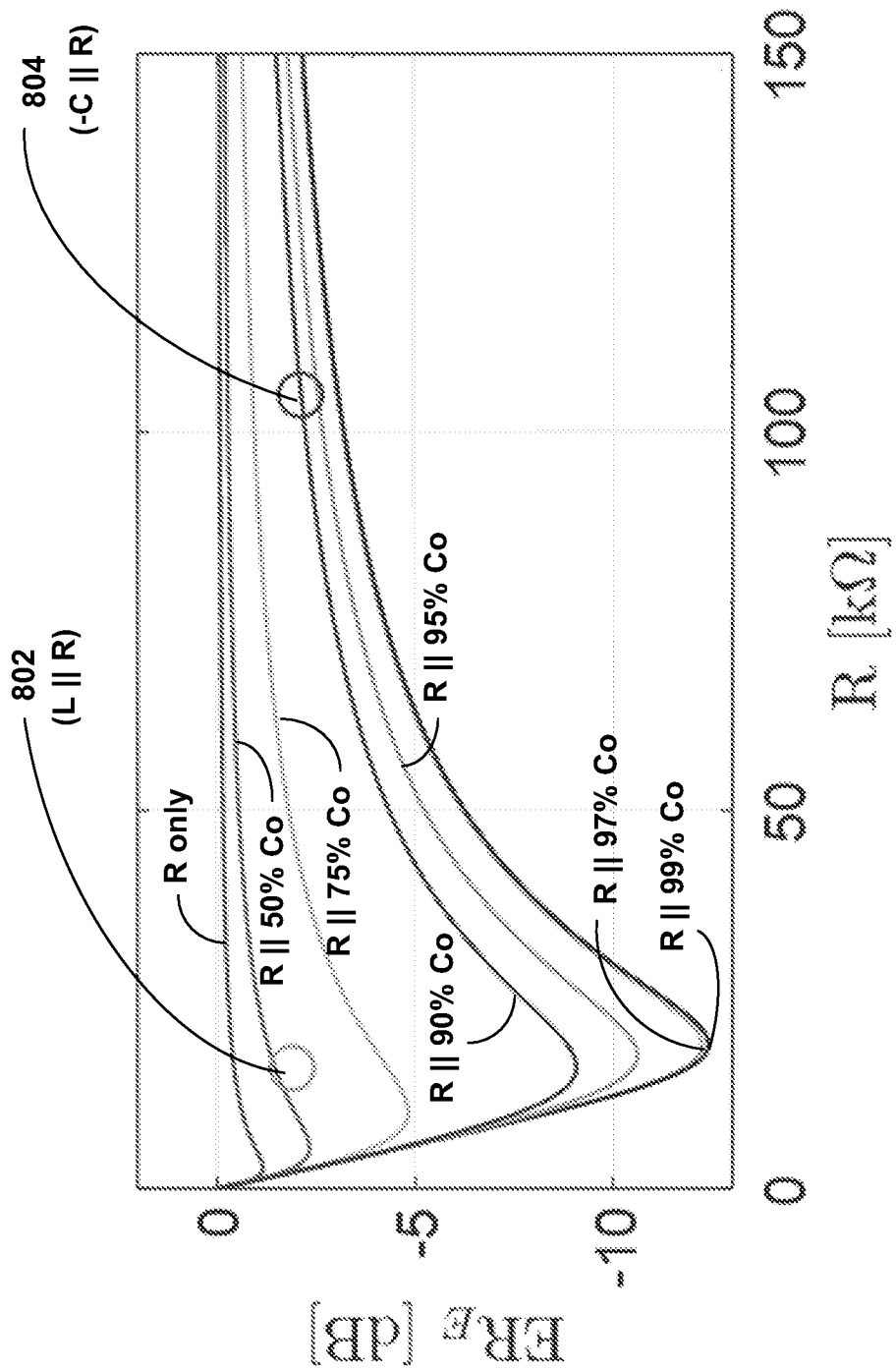
FIG. 8 depicts the variation of electrical power reflectivity $ER_E$ with varying parallel resistance for different terminations, including resistance-only matching.

FIG. 8 depicts the variation of electrical power reflectivity ($ER_E$) with varying parallel resistance for different terminations, including resistance-only matching. As indicated, the points for optimal L//R 802 and minimum acoustic reflectivity ($ER_A$) using (−C//R) 704 occur at different values of R. In accordance with certain implementations of the disclosed technology, negating the CMUT capacitance provides better power transfer with maximum power transfer over the 5-15 MHz bandwidth. FIG. 8 provides a comprehensive comparison of different termination schemes. Negative capacitance impedance matching improves the $ER_E$ and reaches a minimum at R=16-19 kΩ with less than −8 dB when the magnitude of C is over $0.9C_o$, as expected from conjugate impedance matching.

When $ER_A$ (normalized to the OC case) is evaluated for similar resistance and capacitance cases, the −C//R matching is an improvement over purely resistive or L//R matching after $C=0.9C_o$. And the resistance value minimizing acoustic reflectivity is 105 kΩ, which is significantly larger compared to the value for minimum $ER_E$. This is in contrast with the equivalent circuit model, it justifies the need for accurate modeling, and highlights the non-obvious contribution of the disclosed technology.

Figure 9:
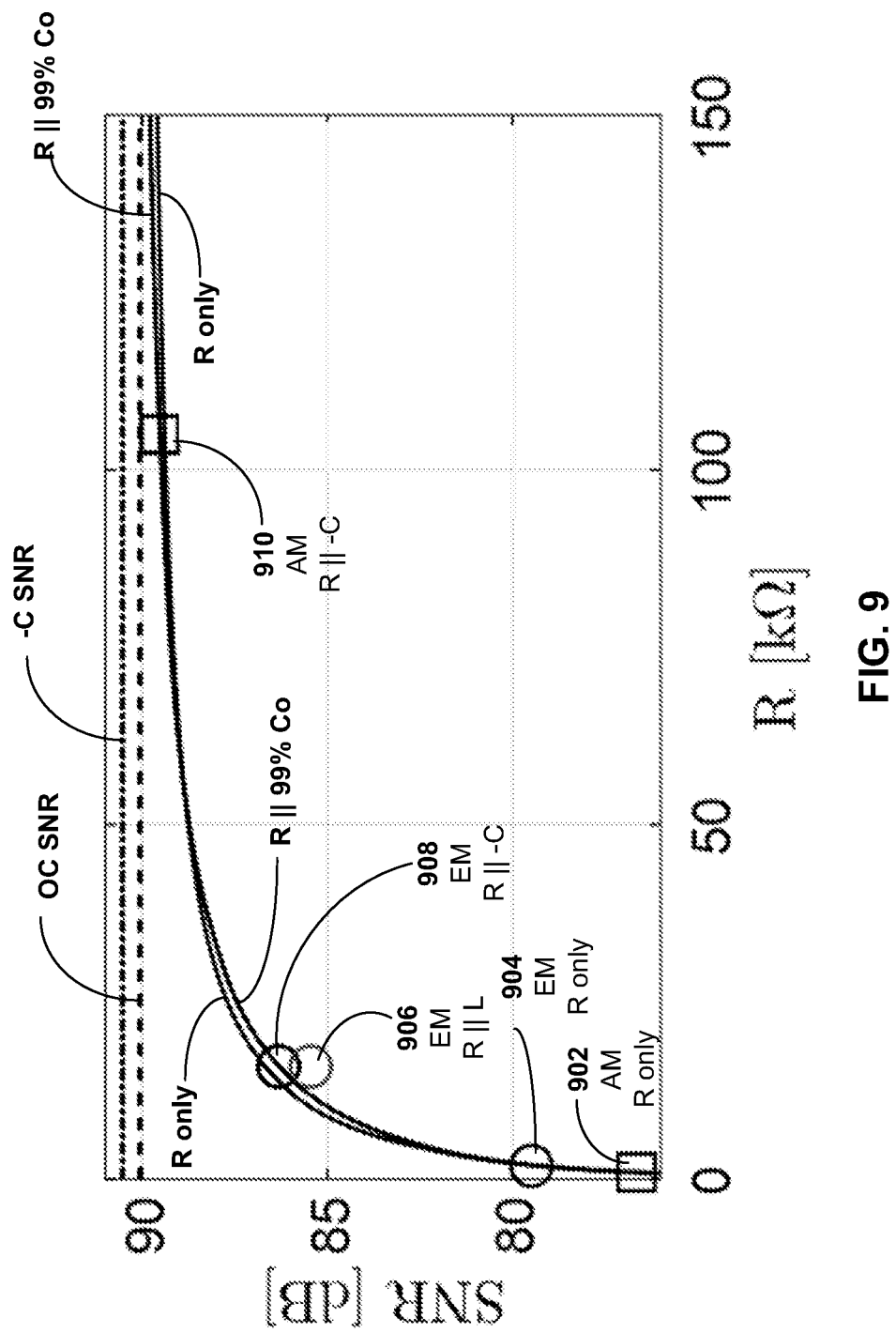
FIG. 9 shows the calculated signal-to-noise ratio (SNR) for different terminations. EM and AM designations indicate the optimal conditions for electrical power and acoustic matching conditions, respectively, for the corresponding matching approach.

FIG. 9 shows the calculated signal-to-noise ratio (SNR) for different terminations. EM and AM designations indicate the optimal conditions for electrical power and acoustic matching conditions, respectively, for the corresponding matching approach. Matching AM for R only 902, matching EM for R only 904, matching EM for R//L 906, matching EM for R//−C 908, and matching AM for R//−C 910 is also shown in FIG. 9. As in the case of equivalent circuit analysis, ideal OC and −C terminations provide higher SNR. Termination with −C termination may provide higher SNR which may be due to its impact on the acoustic crosstalk, hence the CMUT impedance. In any case, with this voltage amplifier detection scheme, there is a tradeoff between SNR and acoustic or electrical matching. If there is no concern with electrical or acoustic matching, −C matching will provide both larger bandwidth and SNR. Similarly, with R only matching, larger resistances will improve SNR. Since increasing load resistance improves the SNR, minimizing acoustic reflectivity, rather than increasing electrical power transfer enables better potential SNR. As a result, it is possible to achieve SNR close to the ideal OC case while providing higher bandwidth and low acoustic reflectivity.

To see the impact of −C//R matching on the overall achievable SNR, this figure is evaluated as a function of termination resistance and several C values. To calculate the SNR, total RMS noise is obtained by integrating the power spectral density (PSD) of the noise voltage, as calculated in equation (10), over the bandwidth of interest (5-15 MHz), and the peak value of the first echo signal is chosen as the signal level.

In accordance with certain exemplary implementations of the disclosed technology, by closely matching the CMUT capacitance with a negative capacitance, the bandwidth of the receiver can be significantly improved as high-frequency roll-off due to device and parasitic capacitance can be prevented. With large area CMUTs, choosing the resistance according to the formula given in equation (9), both the electrical and acoustic reflectivity can be improved with a small degradation in SNR. A more accurate model considering the higher-order membrane modes and array effect confirms the general trend for bandwidth, but it provides information on limits of bandwidth improvement. Load resistance for minimum acoustic reflectivity may be larger than required for maximum electrical power transfer.

According to an exemplary implementation of the disclosed technology, by reducing acoustic reflectivity in a broad bandwidth, the non-uniformity of the CMUT array may be reduced. In certain exemplary implementations, negative capacitance-based broadband impedance matching can improve the imaging performance of the CMUT arrays by not only reducing the clutter due to undesired echoes but also with more ideal array behavior over a larger bandwidth.

Figure 10:
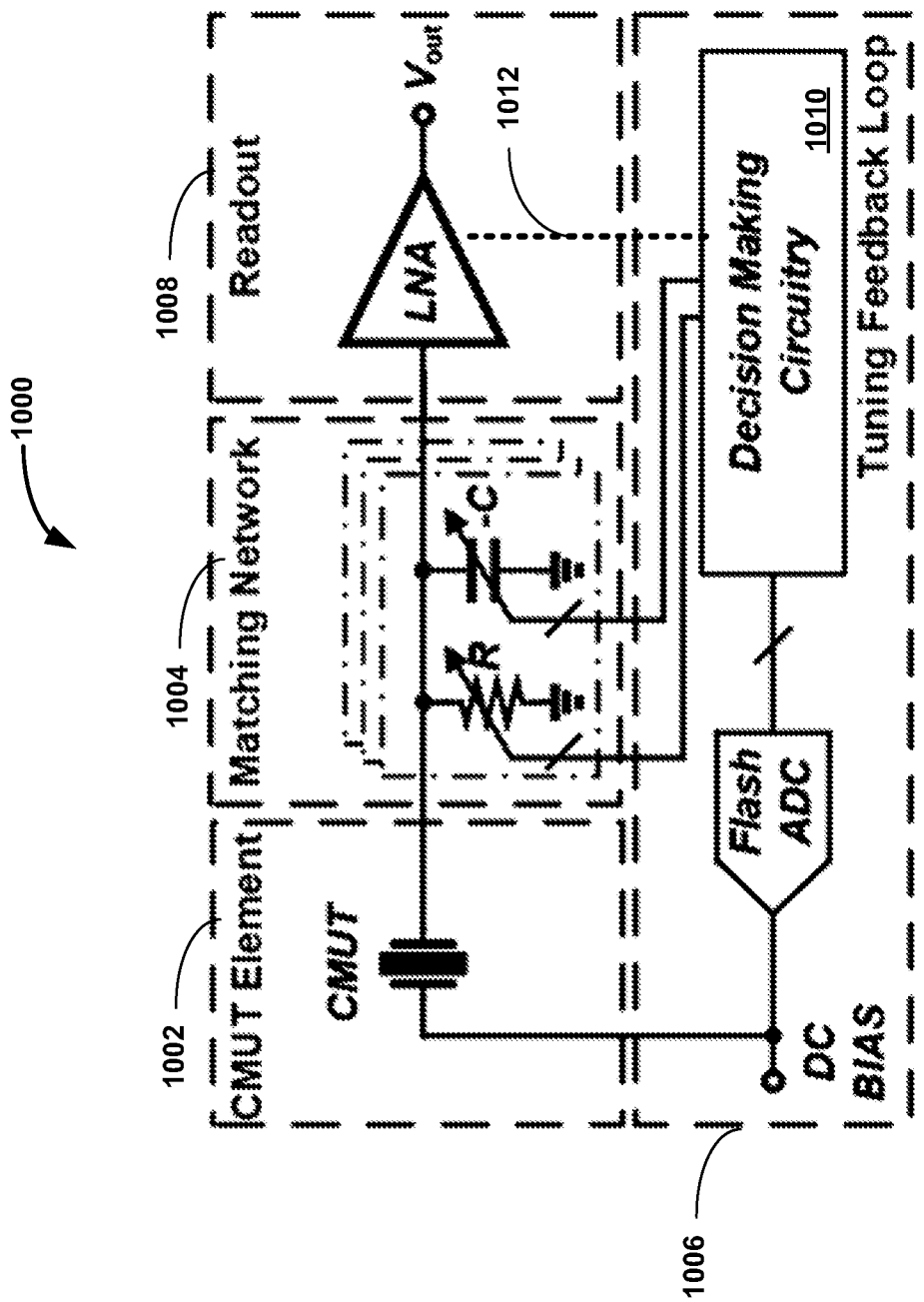
FIG. 10 is a block circuit diagram of a CMUT receive system with impedance matching parameters controlled by the input DC bias to optimize performance over different operation modes and frequencies according to an exemplary implementation of the disclosed technology.

FIG. 10 is a block circuit diagram of a CMUT receive system 1000 with impedance matching parameters controlled by the input DC bias to optimize performance over different operation modes and frequencies. In certain exemplary implementations, the input DC bias that is applied to the CMUT element 1002 can also be provided as an input to the decision-making circuitry 1010 to set circuit parameters (R and −C values) of the matching network 1004. In certain exemplary implementations, the decision-making circuitry 1010 can be configured as a lookup table that links previously measured and/or computed optimal R and C values to the DC bias value. In certain exemplary implementations, the decision making circuitry 1010 can digitally control R and C of the matching network 1004. In certain exemplary implementations, the decision making circuitry 1010 can include analog circuitry to control R and C of the matching network 1004, for example, by comparing the input DC bias voltage to a referenced voltage.

The nonlinear behavior of CMUTs can influence the selection of interface electronics associated with the receive system 1000. For example, in current-based CMUT readout schemes, the performance of the first stage of the readout circuit 1008 can directly depend on the CMUT characteristics. In certain exemplary implementations, a transimpedance amplifier (TIA) may be used to convert the current to voltage. The bandwidth of the TIA is based on its dominant pole which is located at the interface of the CMUT and the TIA. As a result, the TIA bandwidth is inversely proportional to the CMUT capacitance. In certain exemplary implementations, control circuitry with negative capacitance matching may be used to eliminate variation at TIA input and may operate to keep this bandwidth constant or tune it to the CMUT frequency range.

In certain exemplary implementations, when a CMUT DC bias increases to cause the CMUT to operate in collapsed mode, the CMUT frequency response shifts to higher frequencies, resulting in an increase of center frequency along with capacitance. In certain exemplary implementations, increased bandwidth may be utilized for the readout 1008. Since TIA bandwidth is generally reduced as the CMUT capacitance increases, certain exemplary implementations may negate the CMUT capacitance and may tune the TIA gain (for example, using tunable matching and gain control) to provide the desired bandwidth for interfacing the CMUT across the DC bias tuning range. In certain implementations, the decision making circuitry 1010 may be configured to output a control signal 1012 to control a gain of a low noise amplifier and/or TIA.

In certain exemplary implementations, real-time control of the matching network 1004 can be accomplished by tuning the feedback loop 1006 using feedforward or feedback control. In feedforward control, the DC bias signal can be used to tune the value of the negative capacitance (−C) in the matching network 1004 to negate the effect of the CMUT capacitance. In the case of feedback control, an analog loop or digital loop can compare the difference between a scaled version of the DC bias voltage and tune the negative capacitor value. Since negative capacitance can degrade the phase of frequency response, certain implementations of the disclosed technology may provide phase margin, particularly as the matching network 1004 is tuned.

In certain exemplary implementations, the active impedance matching network 1004 may consume power and add noise, which can be a factor in the design of the system 1000 when high SNR is needed. According to an exemplary implementation of the disclosed technology, active R//(−C) matching in the matching network 1004 may be utilized to improve the SNR. In certain exemplary implementations, the SNR can be improved as the ultrasonic pressure to output signal gain can be set by the readout 1008 so that it is larger than the corresponding increase in noise in the system due to the introduction of the active impedance matching network 1004.

According to certain exemplary implementations, a circuit generating negative capacitance close to −C value and a load resistance larger than R may provide a good compromise with SNR, bandwidth, and acoustic reflectivity. Canceling transducer capacitance in a broadband impedance matching approach may be used for other types of transducers, such as bulk piezoelectric transducers and piezoelectric micromachined ultrasonic transducers (PMUTs), whose characteristic is dominated by a capacitive response.

In certain exemplary implementations, the active circuitry that provides negative capacitance can be tunable to accommodate the large capacitance changes with the DC bias in the collapsed mode operation.

In accordance with certain exemplary implementations of the disclosed technology, negative capacitance circuitry can be utilized to improve the bandwidth of the CMUT system. In some implementations, the impact on overall system SNR can depend on the dominant noise sources. For CMUT thermal noise limited detectors, added circuits may decrease the SNR, whereas in cases where noise due to other sources such as transmit-receive switches are significant, the system SNR can be improved along with the bandwidth.

Figure 11:
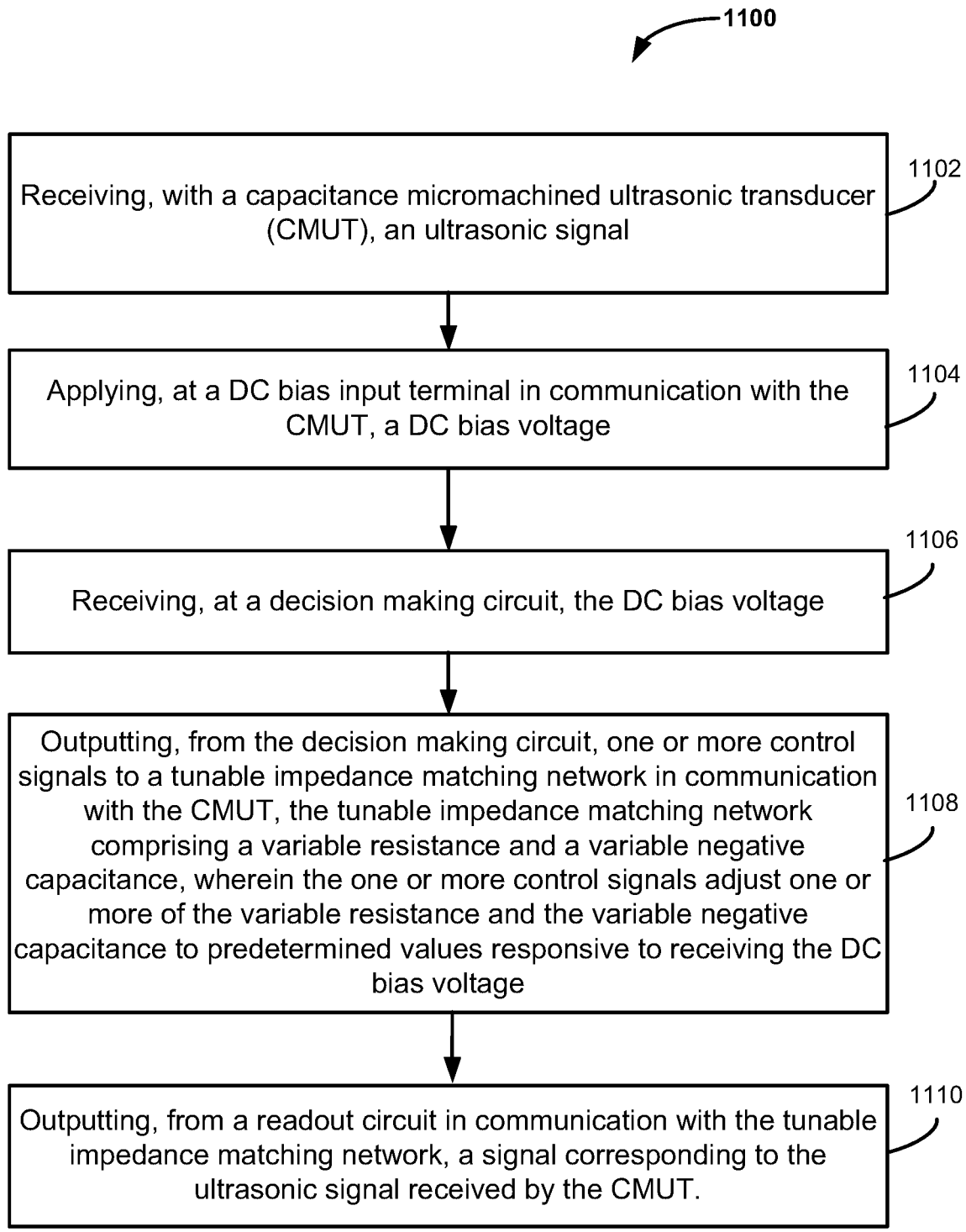
FIG. 11 is a flow diagram of a method, according to an exemplary implementation of the disclosed technology.

FIG. 11 is a flow diagram of a method 1100 for controlling an impedance matching network of a CMUT receiver, according to an exemplary implementation of the disclosed technology. In block 1102, method 1100 receiving, with a capacitance micromachined ultrasonic transducer (CMUT), an ultrasonic signal. In block 1104, method 1100 includes applying, at a DC bias input terminal in communication with the CMUT, a DC bias voltage. In block 1106, method 1100 includes receiving, at a decision making circuit, the DC bias voltage. In block 1108, method 1100 includes outputting, from the decision making circuit, one or more control signals to a tunable impedance matching network in communication with the CMUT, the tunable impedance matching network comprising a variable resistance and a variable negative capacitance, wherein the one or more control signals adjust one or more of the variable resistance and the variable negative capacitance to predetermined values responsive to receiving the DC bias voltage. In block 1110, method 1100 includes outputting, from a readout circuit in communication with the tunable impedance matching network, a signal corresponding to the ultrasonic signal received by the CMUT.

In certain exemplary implementations, outputting the one or more control signals from the decision making circuit may adjust the variable resistance and the variable negative capacitance for minimum acoustic reflectivity.

According to an exemplary implementation of the disclosed technology, outputting the one or more control signals from the decision making circuit may adjust the variable resistance to a value greater than a maximum power transfer resistive value.

Certain exemplary implementations of the disclosed technology can include supplying, from a DC bias controller in communication with the DC bias input terminal, a bias voltage input to adapt a frequency response of the CMUT. In certain exemplary implementations, the bias voltage may cause the CMUT to operate in one or more of a non-collapsed mode, a collapsed mode, and a deep-collapsed mode.

According to an exemplary implementation of the disclosed technology, outputting, from the decision making circuit, the one or more control signals to a tunable impedance matching network may adjust values of one or more of the variable resistance and the variable negative capacitance separately for a collapsed mode, a non-collapsed mode, and a deep-collapsed mode of the CMUT.

In certain exemplary implementations, the CMUT can include an array of CMUT elements, and at least a portion of the array of CMUT elements may be independently controllable.

Certain exemplary implementations of the disclosed technology may include amplifying the signal corresponding to the ultrasonic signal received by the CMUT, where the decision making circuitry may be configured to control a gain of an amplifier in communication with the tunable impedance matching network.

In certain exemplary implementations, the decision making circuitry may be configured to control the gain of the amplifier to automatically set a pressure-to-signal conversion gain greater than a corresponding increase in a system noise introduced by at least the tunable impedance matching network.

In certain exemplary implementations, outputting the one or more control signals may adjust values of one or more of the variable resistance and the variable negative capacitance. In certain exemplary implementations of the disclosed technology outputting the one or more control signals may adjust a tradeoff between electrical power transfer and acoustic reflectivity of the CMUT.

In certain exemplary implementations, the CMUT can include an array of CMUT elements, where outputting the one or more control signals may adjust values of one or more of the variable resistance and the variable negative capacitance to reduce acoustic crosstalk and improve array response uniformity.

According to an exemplary implementation of the disclosed technology, outputting, from the decision making circuit, one or more control signals may be controlled by a lookup table, where the lookup table may be configured to cause the decision making circuitry to output one or more signals based on the DC bias voltage.

In some implementations, the CMUT element may be characterized as having lateral dimensions ranging from one-tenth to one-half of a wavelength of the ultrasonic signal.

In certain exemplary implementations, the CMUT can be characterized as an array of CMUT elements having dimensions and/or pitch ranging from one third of a wavelength to two wavelengths of the ultrasonic signal.

In certain exemplary implementations, the CMUT can include a membrane element having lateral dimensions between 5 um and 250 um.

Although preferred embodiments of the disclosed technology are explained in detail, it is to be understood that other embodiments are contemplated. Accordingly, it is not intended that the disclosed technology is limited in its scope to the details of construction and arrangement of components set forth in the following description or illustrated in the drawings. The disclosed technology is capable of other embodiments and of being practiced or carried out in various ways. As used in the specification and the appended claims, the singular forms "a," "an," and "the" include plural referents unless the context dictates otherwise.

It is intended that each term presented herein contemplates its broadest meaning as understood by those skilled in the art and may include all technical equivalents, which operate similarly to accomplish a similar purpose.

Ranges may be expressed herein as from "about" or "approximately" one particular value and/or to "about" or "approximately" another particular value. When such a range is expressed, another embodiment may include from the one particular value and/or to the other particular value. Similarly, values may be expressed herein as "about" or "approximately."

The terms "comprising" or "containing" or "including" means that at least the named element, material, or method step is present in the apparatus or method, but does not exclude the presence of other elements, materials, and/or method steps, even if the other elements, materials, and/or method steps have the same function as what is named.

The term "exemplary" as used herein is intended to mean "example" rather than "best" or "optimum."

Numerous characteristics and advantages have been set forth in the foregoing description, together with details of structure and function. While the disclosed technology has been presented in several forms herein, it may be apparent to those skilled in the art that many modifications, additions, and deletions, especially in matters of shape, size, and arrangement of parts, can be made therein without departing from the spirit and scope of the disclosure and its equivalents as set forth in the following claims. Therefore, other modifications or embodiments as may be suggested by the teachings herein are particularly reserved as they fall within the breadth and scope of the claims.

The invention claimed is:

1. An ultrasonic receiver system comprising:
  a tunable impedance matching network in communication with a capacitance micromachined ultrasonic transducer (CMUT);
  decision making circuitry in communication with the tunable impedance matching network and a DC bias input terminal, wherein the decision making circuitry is configured to adjust one or more of variable resistance and variable negative capacitance of the tunable impedance matching network to predetermined values responsive to a bias voltage input to the DC bias input terminal; and
  a readout circuit in communication with the tunable impedance matching network, the readout circuit configured to output a signal corresponding to an ultrasonic signal received by the CMUT.

2. The ultrasonic receiver system of claim 1 further comprising:
  the CMUT, being configured to receive the ultrasonic signal; and
  the DC bias input terminal, being in communication with the CMUT;
  wherein the tunable impedance matching network comprises:
    the variable resistance; and
    the variable negative capacitance; and
  wherein the ultrasonic receiver system is configured for active impedance control.

3. The ultrasonic receiver system of claim 2, wherein the decision making circuitry is further configured to adjust:
  the variable resistance and the variable negative capacitance for minimum acoustic reflectivity;

values of one or more of the variable resistance and the variable negative capacitance separately for a collapsed mode, a non-collapsed mode, and a deep-collapsed mode of the CMUT;

values of one or more of the variable resistance and the variable negative capacitance to optimize a tradeoff between electrical power transfer and acoustic reflectivity of the CMUT;

values of one or more of the variable resistance and the variable negative capacitance to reduce acoustic crosstalk and improve array response uniformity; and/or the variable resistance to a value greater than a maximum power transfer resistive value.

4. The ultrasonic receiver system of claim 2 further comprising a DC bias controller in communication with the DC bias input terminal;

wherein the DC bias controller is configured to supply the bias voltage input to adapt a frequency response of the CMUT.

5. The ultrasonic receiver system of claim 4, wherein the DC bias controller is further configured to supply the bias voltage to cause the CMUT to operate in one or more of a non-collapsed mode, a collapsed mode, and a deep-collapsed mode.

6. The ultrasonic receiver system of claim 2, wherein one or more of the tunable impedance matching network, the decision making circuitry, and the readout circuit are integrated with the CMUT.

7. The ultrasonic receiver system of claim 2, wherein the CMUT comprises an array of CMUT elements.

8. The ultrasonic receiver system of claim 7, wherein at least a portion of the array of CMUT elements are configured to be independently controllable.

9. The ultrasonic receiver system of claim 2, wherein the readout circuit comprises an amplifier in communication with the tunable impedance matching network and the decision making circuitry; and wherein the decision making circuitry is further configured to control a gain of the amplifier.

10. The ultrasonic receiver system of claim 9, wherein decision making circuitry is further configured to control a gain of the amplifier to automatically set a pressure-to-signal conversion gain greater than a corresponding increase in a system noise introduced by at least the tunable impedance matching network.

11. The ultrasonic receiver system of claim 2, wherein the decision making circuitry comprises a lookup table;

wherein the lookup table is configured to cause the decision making circuitry to output one or more signals based on the bias voltage input to the DC bias input terminal.

12. The ultrasonic receiver system of claim 2, wherein the CMUT comprises:

a membrane element having lateral dimensions ranging from one tenth to one half of a wavelength of the ultrasonic signal;

an array of CMUT elements having pitch dimensions ranging from one third of a wavelength to two wavelengths of the ultrasonic signal; and/or a membrane element having lateral dimensions between 5 µm and 250 µm.

13. A method comprising:

receiving, at a decision making circuit, a DC bias voltage;

outputting, from the decision making circuit, one or more control signals to a tunable impedance matching network in communication with a capacitance micromachined ultrasonic transducer (CMUT); and outputting, from a readout circuit in communication with the tunable impedance matching network, a signal corresponding to an ultrasonic signal received by the CMUT wherein the tunable impedance matching network comprises a variable resistance and a variable negative capacitance; and wherein one or more of the control signals adjusts one or more of the variable resistance and the variable negative capacitance to predetermined values responsive to receiving the DC bias voltage.

14. The method of claim 13 further comprising: receiving, with the CMUT, the ultrasonic signal; and applying, at a DC bias input terminal in communication with the CMUT, the DC bias voltage; wherein the method is a method of actively controlling the tunable impedance matching network of the CMUT receiver.

15. The method of claim 14 further comprising supplying, from a DC bias controller in communication with the DC bias input terminal, a bias voltage input to adapt a frequency response of the CMUT.

16. The method of claim 15, wherein the bias voltage causes the CMUT to operate in one or more of a non-collapsed mode, a collapsed mode, and a deep-collapsed mode.

17. The method of claim 14, wherein outputting the one or more control signals adjusts:

the variable resistance and the variable negative capacitance for minimum acoustic reflectivity;

the variable resistance to a value greater than a maximum power transfer resistive value;

values of one or more of the variable resistance and the variable negative capacitance and adjusts a tradeoff between electrical power transfer and acoustic reflectivity of the CMUT; and/or values of one or more of the variable resistance and the variable negative capacitance separately for a collapsed mode, a non-collapsed mode, and a deep-collapsed mode of the CMUT.

18. The method of claim 14, wherein the CMUT comprises an array of CMUT elements; and wherein at least a portion of the array of CMUT elements are independently controllable.

19. The method of claim 14 further comprising amplifying the signal corresponding to the ultrasonic signal received by the CMUT;

wherein the decision making circuitry is configured to control a gain of an amplifier in communication with the tunable impedance matching network.

20. The method of claim 19, wherein decision making circuitry is further configured to control the gain of the amplifier to automatically set a pressure-to-signal conversion gain greater than a corresponding increase in a system noise introduced by at least the tunable impedance matching network.

21. The method of claim 14, wherein the CMUT comprises an array of CMUT elements; and wherein outputting one or more control signals adjusts values of one or more of the variable resistance and the variable negative capacitance and reduces acoustic crosstalk and improves array response uniformity.

22. The method of claim 14, wherein outputting the one or more control signals is controlled by a lookup table;

wherein the lookup table is configured to cause the decision making circuitry to output one or more signals based on the DC bias voltage.

23. The method of claim 14, wherein the CMUT comprises:
- a membrane element having lateral dimensions ranging from one tenth to one half of a wavelength of the ultrasonic signal;
- an array of CMUT elements having pitch dimensions ranging from one third of a wavelength to two wavelengths of the ultrasonic signal; and/or
- a membrane element having lateral dimensions between 5 μm and 250 μm.

* * * * *